United States Patent
Peter et al.

(10) Patent No.: US 8,592,840 B2
(45) Date of Patent: Nov. 26, 2013

(54) OPTOELECTRONIC SEMICONDUCTOR CHIP AND USE OF AN INTERMEDIATE LAYER BASED ON ALGAN

(75) Inventors: Matthias Peter, Regensburg (DE); Tobias Meyer, Ihrlerstein (DE); Nikolaus Gmeinwieser, Obertraubling (DE); Tetsuya Taki, Yokohama (JP); Hans-Jürgen Lugauer, Sinzing (DE); Alexander Walter, Laaber (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/519,345

(22) PCT Filed: Dec. 20, 2010

(86) PCT No.: PCT/EP2010/070274
§ 371 (c)(1),
(2), (4) Date: Jul. 18, 2012

(87) PCT Pub. No.: WO2011/080144
PCT Pub. Date: Jul. 7, 2011

(65) Prior Publication Data
US 2012/0313138 A1    Dec. 13, 2012

(30) Foreign Application Priority Data
Dec. 30, 2009  (DE) .......... 10 2009 060 749

(51) Int. Cl.
*H01L 33/00* (2010.01)
(52) U.S. Cl.
USPC .................. 257/94; 257/E33.03

(58) Field of Classification Search
CPC ........ H01L 33/32; H01L 33/39; H01L 33/007
USPC ............... 257/79, 94, 101, E33.03
See application file for complete search history.

(56) References Cited

U.S. PATENT DOCUMENTS

| 6,121,638 | A | 9/2000 | Rennie et al. |
| 6,147,364 | A | 11/2000 | Itaya et al. |
| 6,849,878 | B2 | 2/2005 | Bader et al. |
| 7,365,369 | B2 | 4/2008 | Nakamura et al. |
| 7,893,424 | B2 | 2/2011 | Eichler et al. |
| 2002/0110945 | A1 | 8/2002 | Kuramata et al. |
| 2003/0218181 | A1* | 11/2003 | Bader et al. ............ 257/102 |
| 2007/0278508 | A1 | 12/2007 | Baur et al. |
| 2008/0093611 | A1 | 4/2008 | Hahn et al. |
| 2010/0219439 | A1* | 9/2010 | Kim ...................... 257/98 |
| 2011/0042643 | A1 | 2/2011 | Stauss et al. |
| 2011/0049555 | A1 | 3/2011 | Engl et al. |

FOREIGN PATENT DOCUMENTS

| DE | 100 42 947 A1 | 3/2002 |
| DE | 10 2005 003 460 A1 | 10/2005 |
| DE | 698 35 216 T2 | 5/2007 |
| DE | 10 2006 046 237 A1 | 1/2008 |

(Continued)

Primary Examiner — Nikolay Yushin
(74) Attorney, Agent, or Firm — DLA Piper LLP (US)

(57) ABSTRACT

An optoelectronic semiconductor chip includes an epitaxially grown semiconductor layer sequence based on GaN, InGaN, AlGaN and/or InAlGaN, a p-doped layer sequence, an n-doped layer sequence, an active zone that generates an electromagnetic radiation and is situated between the p-doped layer sequence and the n-doped layer sequence, and at least one $Al_xGa_{1-x}N$-based intermediate layer where $0<x\le 1$, which is situated at a same side of the active zone as the n-doped layer sequence.

14 Claims, 6 Drawing Sheets

(56) References Cited

FOREIGN PATENT DOCUMENTS

| | | |
|---|---|---|
| DE | 10 2007 046 027 A1 | 4/2009 |
| DE | 10 2007 057 241 A1 | 6/2009 |
| DE | 10 2008 032 318 A1 | 10/2009 |
| EP | 1 505 698 A2 | 2/2005 |
| EP | 1 814 164 A2 | 8/2007 |
| EP | 2 019 437 A1 | 1/2009 |
| WO | 2005/036658 A1 | 4/2005 |

* cited by examiner

FIG 7
A)
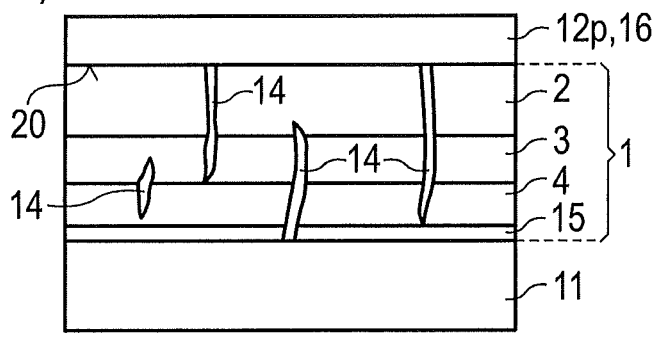
B)
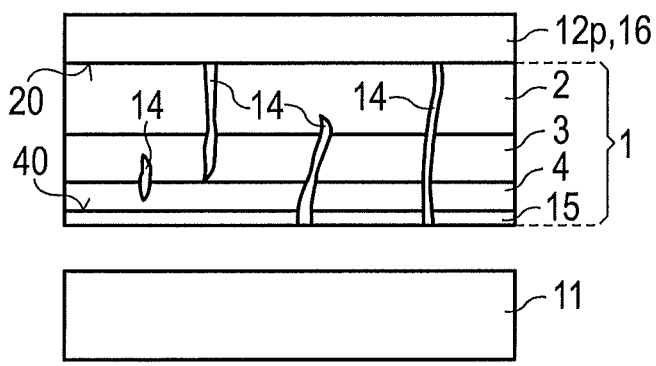
FIG 8
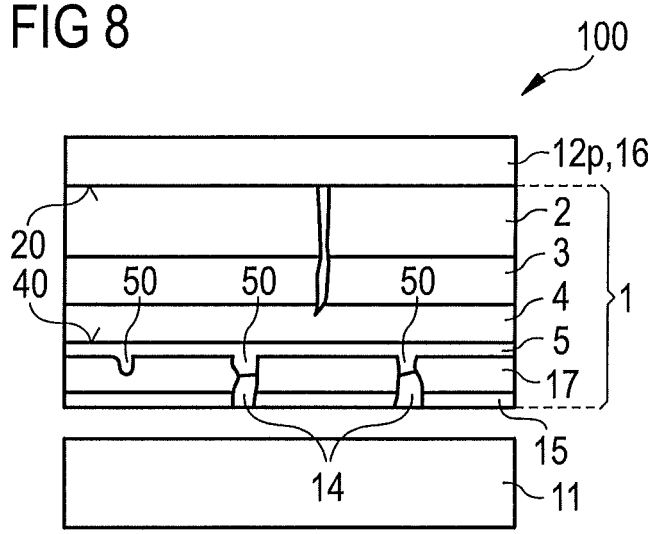

US 8,592,840 B2

OPTOELECTRONIC SEMICONDUCTOR CHIP AND USE OF AN INTERMEDIATE LAYER BASED ON ALGAN

RELATED APPLICATIONS

This is a §371 of International Application No. PCT/EP2010/070274, with an international filing date of Dec. 20, 2010 (WO 2011/080144, published Jul. 7, 2011), which is based on German Patent Application No. 10 2009 060 749.8, filed Dec. 30, 2009, the subject matter of which is incorporated by reference.

TECHNICAL FIELD

This disclosure relates to an optoelectronic semiconductor chip comprising an intermediate layer based on AlGaN and use of an intermediate layer based on AlGaN.

BACKGROUND

It could be helpful to provide an optoelectronic semiconductor chip having a high impermeability relative to liquid chemicals.

SUMMARY

We provide an optoelectronic semiconductor chip including an epitaxially grown semiconductor layer sequence based on GaN, InGaN, AlGaN and/or InAlGaN, a p-doped layer sequence, an n-doped layer sequence, an active zone that generates an electromagnetic radiation and is situated between the p-doped layer sequence and the n-doped layer sequence, and at least one $Al_xGa_{1-x}$N-based intermediate layer where $0<x\leq1$, which is situated at a same side of the active zone as the n-doped layer sequence, wherein at least one of a) or b) is present: a) the intermediate layer has elevations extending into cracks and/or holes in a layer of the semiconductor layer sequence that adjoins the intermediate layer, wherein the elevations at least in places are in direct contact with boundary areas of the cracks and/or holes and at least some or all of the cracks and/or holes are completely covered by the intermediate layer, b) the intermediate layer reduces a size of the cracks and/or holes along a growth direction of the semiconductor layer sequence, wherein at least one portion of the cracks and/or holes extends on both sides of the intermediate layer.

BRIEF DESCRIPTION OF THE DRAWINGS

FIGS. 1 to 6, 8, 9 and 11 show schematic sectional illustrations of examples of optoelectronic semiconductor chips described herein.

FIGS. 7 and 10 show schematic sectional illustrations of light emitting diode chips.

DETAILED DESCRIPTION

Figure 1:
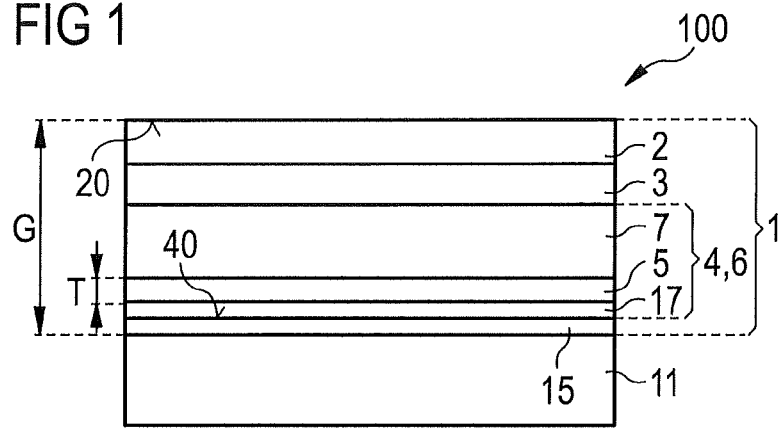

The optoelectronic semiconductor chip may comprise, in particular, an epitaxially grown, semiconductor layer sequence based on GaN, InGaN, AlGaN and/or InAlGaN. "Based on" means that the semiconductor layer sequence predominantly comprises at least one of the stated materials or consists thereof. This does not rule out the fact that the semiconductor layer sequence can comprise comparatively small amounts of further substances, in particular dopants.

The semiconductor layer sequence may comprise a p-doped layer sequence, an n-doped layer sequence, and an active zone situated between the p-doped layer sequence and the n-doped layer sequence. In this case, the term layer sequence does not preclude the layer sequence from comprising only a single layer that is homogeneous with regard to its physical properties. "Layer" should be understood to mean, in particular, a region which extends in a direction perpendicular to a growth direction of the semiconductor layer sequence over the entire semiconductor layer sequence or over a predominant part of the semiconductor layer sequence, for example, over more than 80%. A layer can, therefore, be a region of the semiconductor layer sequence that is shaped in planar fashion and is oriented perpendicular to a growth direction and has a specific physical property such as a specific material composition. Different layers or regions can be separated from one another by a sharp transition in a direction parallel to the growth direction. "Sharp transition" means, in particular, that a transition region between the layers or regions is effected with regard to the physical property thereof such as material composition, within the scope of the production tolerances and/or amounts to at most five monolayers, in particular, at most two monolayers, of a crystal structure.

The active zone may be designed to generate an electromagnetic radiation in the ultraviolet, in the visible and/or in the near-infrared spectral range during operation of the semiconductor chip. In particular, a main wavelength of the radiation generated by the active zone during operation of the semiconductor chip is at wavelengths of 380 nm to 550 nm. The main wavelength is that wavelength at which the radiation generated in the active zone has a maximum intensity per nm of spectral width. A radiation emitted by the semiconductor chip and generated in the active zone is furthermore preferably an incoherent radiation. In other words, the semiconductor chip is then configured as a light emitting diode and not as a laser diode or as a super luminescence diode.

The semiconductor layer sequence may comprise an intermediate layer based on $Al_xGa_{1-x}$N. In this case, x is greater than 0 and less than 1. In other words, the intermediate layer is a GaN-based layer in which a specific proportion of Ga lattice sites is occupied by Al atoms. The intermediate layer is situated on the same side of the active zone as the n-doped layer sequence.

The intermediate layer or one of the intermediate layers may be undoped. "Undoped" means, in particular, that a dopant concentration is less than $5\times10^{16}$ per $cm^3$. The intermediate layer can then directly adjoin the n-doped layer sequence. In other words, a material of the intermediate layer is then in direct contact with an n-doped material of the n-doped layer sequence. Preferably, the intermediate layer is situated within the semiconductor layer sequence such that the intermediate layer does not form a boundary area of the semiconductor layer sequence in a direction parallel to the growth direction.

The intermediate layer or at least one of the intermediate layers may be situated within the n-doped layer sequence and is itself n-doped. The fact that the intermediate layer is situated within the n-doped layer sequence means that the intermediate layer adjoins further, n-doped regions of the n-doped layer sequence at both sides. Therefore, the intermediate layer then does not form a boundary area of the n-doped layer sequence in a direction parallel to the growth direction.

A specific chemical permeability of the intermediate layer may be less than for regions or layers of the semiconductor layer sequence that adjoin the intermediate layer. In particular, the at least one intermediate layer has a specific chemical permeability which corresponds to a minimum specific chemical permeability of the entire semiconductor layer sequence or of the entire n-doped layer sequence. Specific chemical permeability means, in particular, permeability relative to a specific geometrical thickness of the layer and to a specific period of time relative to the liquids having a particularly low viscosity. Low viscosity can mean that the liquid has a viscosity of at most 2.5 mPas. This is taken to mean, in particular, those liquids or chemicals which do not decompose the intermediate layer. By way of example, the intermediate layer, especially compared with the rest of the semiconductor layer sequence, is impermeable to liquid chemicals such as nitric acid. Likewise, the intermediate layer is preferably impermeable to vapors. Furthermore, the intermediate layer preferably inhibits diffusion of metals such as silver or the intermediate layer is not penetrated by metals by diffusion or is penetrated in a reduced fashion in comparison with the other layers of the semiconductor layer sequence.

The optoelectronic semiconductor chip may comprise a preferably epitaxially grown semiconductor layer sequence based on GaN, InGaN, AlGaN and/or InAlGaN. The semiconductor layer sequence comprises a p-doped layer sequence, an n-doped layer sequence, and an active zone provided to generate an electromagnetic radiation and situated between the p-doped and n-doped layer sequences. Furthermore, the semiconductor layer sequence comprises at least one $Al_xGa_{1-x}N$-based undoped or n-doped intermediate layer, where $0<x\leq 1$. The intermediate layer is preferably situated within the semiconductor layer sequence and has, in particular, a specific chemical permeability especially relative to liquids having low viscosity which is lower than a specific chemical permeability of regions or layers of the semiconductor layer sequence that adjoin the intermediate layer.

Permeability of the semiconductor layer sequence relative to liquid chemicals such as nitric acid can be efficiently reduced by use of such an intermediate layer. As a result, a higher yield during manufacture and a higher reliability of the semiconductor chips can be realized. The permeability of layers of the semiconductor layer sequence relative to liquid chemicals or relative to vapors is caused, for example, by dislocations such as so-called "threading" dislocations which can form channels or holes in the semiconductor material. The cracks are dislocation lines, for example. The AlGaN of the intermediate layer can deposit in and/or attach to the holes and/or cracks, as a result of which the cracks and/or holes and/or nuclei of the dislocation lines can be reduced in size.

Layers of the n-doped layer sequence or of the semiconductor layer sequence that adjoin the intermediate layer may have cracks and/or holes extending transversely with respect to a main direction of extent of the intermediate layer. Along a lateral direction, that is to say a direction perpendicular to a growth direction of the semiconductor layer sequence, the cracks and/or the holes have lateral extents on the nanometer scale or micrometer scale. The extent of the holes and/or cracks in a lateral direction is, for example, at most 25 nm or at most 50 nm or at most 0.10 μm or at most 0.25 μm or at most 0.40 μm.

The intermediate layer may close off at least one portion of the cracks and/or of the holes. In other words, the intermediate layer covers at least one portion of the holes and/or of the cracks completely. In particular, the intermediate layer has elevations extending away from the active zone and/or toward the active zone into the cracks and/or into the holes. The elevations, which are preferably formed with the same material as the intermediate layer in places are in immediate, direct, physical contact with a material of the layer into which the cracks and/or the holes extend.

The intermediate layer may reduce the diameter and/or span of the holes and/or cracks. That is to say that at least one portion of the cracks and/or holes, for example, more than 80% or more than 95% or more than 99% of the holes and/or cracks, are, as seen along the growth direction, smaller downstream of the intermediate layer than upstream of the intermediate layer. This includes the holes and/or cracks being completely covered and/or blocked and/or interrupted by the intermediate layer.

The holes and/or cracks, as seen along the growth direction, may extend further at least in part downstream of the intermediate layer. In other words, it is possible that the intermediate layer seals the holes and/or cracks relative to penetration of liquid chemicals, but does not eliminate the holes and/or cracks as defects in the crystal lattice such that the cracks and/or holes are present at least partly on both sides of the intermediate layer. By way of example, the number of holes as seen in the growth direction directly downstream of the intermediate layer, is at least 50% or at least 75% or at least 90% and/or at most 90% or at most 95% of the number of holes directly upstream of the intermediate layer. With regard to the cracks or dislocation lines, it is possible for the latter to be completely eliminated or reduced in their number by at least 50% or by at least 75% or by at least 90% by the intermediate layer.

Semiconductor layer sequences for optoelectronic semiconductor chips, in particular for light emitting diodes, are epitaxially grown on sapphire substrates, for example. During growth, holes can arise in the semiconductor material to be grown. Likewise, cracks can arise in a laser lift-off method, wherein the finished grown semiconductor layer sequence is removed from the substrate. The holes and/or cracks at a boundary area of the semiconductor layer sequence formerly facing the substrate can be uncovered, for example, during the laser lift-off method itself or during production of a roughening by wet etching, for instance, such that at least one portion of the holes and/or cracks, therefore, reaches as far as the boundary area of the semiconductor layer sequence.

Via these uncovered holes and/or cracks, a liquid chemical can penetrate through the semiconductor layer sequence into a subsequent process step and, in particular, attack a mirror, for example, a silver mirror which was previously applied to a side of the semiconductor layer sequence facing away from the growth substrate or to a plated-through hole. Such damage to the mirror reduces a light coupling-out efficiency. The cracks and/or holes, which also constitute defects in the semiconductor layer sequence, can furthermore result in a reduction of efficiency during generation of the radiation in the active zone. Likewise, the cracks and/or holes can give rise to small-current problems in the current-voltage characteristic of the semiconductor chip.

Since, during epitaxial growth, for example, during a so-called "MOVPE process," Al atoms at a crystal surface exhibit a lower mobility than Ga atoms, AlGaN layers can have a smoothing effect on a surface morphology in comparison with pure GaN layers during growth. AlGaN layers, therefore, react significantly less sensitively to facet growth than GaN layers as a result of which holes, cracks and/or channels possibly present in a GaN crystal can be closed or reduced in size by such an AlGaN layer.

The intermediate layer or one of the intermediate layers is doped with a dopant concentration of $2\times 10^{18}$ per $cm^3$ to $5\times 10^{19}$ per $cm^3$, preferably with a dopant concentration of $4\times 10^{18}$ per $cm^3$ to $3\times 10^{19}$ per $cm^3$, in particular of $6\times 10^{18}$ per $cm^3$ to $2\times 10^{19}$ per $cm^3$. A doping is effected with Si atoms, for example.

The proportion x of the Ga lattice sites occupied by Al atoms may have a value of 0.03 to 0.2 or 0.03 to 0.5, preferably 0.07 to 0.13, for example, around 0.1.

The intermediate layer may have a thickness of 5 nm to 250 nm or 15 nm to 200 nm, in particular 25 nm to 100 nm.

The intermediate layer, exactly one of the intermediate layers or at least one of the intermediate layers may be an uninterrupted, continuous layer. In other words, in a direction perpendicular to the growth direction, no openings or perforations are then produced in the intermediate layer in a targeted manner. The intermediate layer, therefore, extends in a direction perpendicular to the growth direction over the entire semiconductor layer sequence, without interruptions produced in a targeted manner being present. The fact that the intermediate layer is an uninterrupted, continuous layer does not preclude defects in the crystal lattice of the semiconductor layer sequence such as cracks and/or holes from forming small, unintentional openings in the intermediate layer. In other words, it is possible for not all of the cracks and/or holes to be closed by the intermediate layer. Preferably, however, such unintentional openings do not occur.

At least one electrical plated-through hole or via may penetrate through the active zone and/or the intermediate layer, in particular exactly one of two intermediate layers which are formed in the semiconductor layer sequence. In this case, it is possible for all the electrical contact-connections that energize the semiconductor chip to be situated at only one side of the active zone. In other words, the semiconductor chip can then be formed as a so-called "flip-chip."

A distance from an outer boundary area of the semiconductor layer sequence through to a mirror for instance at the plated-through hole may be comparatively small and may be, for example, approximately 2 µm. In the case of such small distances, the probability of cracks and/or holes in the semiconductor layer sequence extending from an outer boundary area as far as the mirror is particularly high, in particular also when the semiconductor layer sequence is separated from a substrate by a laser lift-off method and when roughening in the semiconductor layer sequence is produced at the outer boundary area. That is to say that, especially in the case of comparatively thin semiconductor layer sequences with plated-through holes, an increase in the yield during production through the use of at least one intermediate layer is particularly great.

The AlGaN-based intermediate layer may adjoin, on both sides, GaN layers having no or no significant Al content. Preferably, at least one of the GaN layers is doped more highly than the intermediate layer and is, for example, a current spreading layer. The other of the GaN layers can have a dopant concentration lower than the intermediate layer by at least a factor of 2.

The optoelectronic semiconductor chip may comprise exactly one or exactly two of the intermediate layers. In that case, preferably no further layers which have a material composition corresponding to the intermediate layers are present in the semiconductor layer sequence. In particular, the intermediate layers are not part of a so-called superlattice.

The use of an AlGaN-based, undoped or n-doped intermediate layer as a closure layer for channels, cracks and/or holes in a semiconductor layer sequence based on AlGaN, InGaN, AlInGan and/or on GaN is furthermore specified. The intermediate layer can be formed as specified in one or more of the examples mentioned above. Therefore, features of the optoelectronic semiconductor chip are also disclosed for the use of the intermediate layer, and vice versa.

An optoelectronic semiconductor chip described here is explained in greater detail below on the basis of selected examples with reference to the Drawings. Identical reference symbols indicate identical elements in the individual figures. In this case, however, relationships to scale are not illustrated. Rather, individual elements may be illustrated with an exaggerated size to afford a better understanding.

FIG. 1 illustrates an example of an optoelectronic semiconductor chip 100. The semiconductor chip 100 is, in particular, a light emitting diode that emits an incoherent radiation during operation.

A semiconductor layer sequence 1 is grown epitaxially on a growth substrate 11. The semiconductor layer sequence 1 is based on GaN, InGaN, AlGaN and/or InAlGaN. A total thickness G of the semiconductor layer sequence 1 is, for example, 1.0 µm to 10 µm, in particular 1.5 µm to 7.0 µm, in particular approximately 5 µm to 6 µm.

An undoped GaN layer 15 is situated directly after the growth substrate 11. The undoped layer 15 has, for example, a thickness of between 300 nm and 400 nm inclusive. An n-doped partial layer 17 is produced at a side of the undoped layer 15 facing away from the growth substrate 11, the partial layer being part of an n-doped layer sequence 4 of the semiconductor layer sequence 1. It is possible for only one of the layers 15, 17 to be present.

Situated at a side of the growth substrate 11 facing away from the n-doped layer sequence 4 is an active zone 3, followed by a p-doped layer sequence 2. The active zone 2 situated between the n-doped layer sequence 4 and the p-doped layer sequence 2 has, in particular, at least one quantum well structure of any desired dimensionality, preferably a plurality of quantum well structures. By way of example, ultraviolet radiation, blue or green light is generated during operation in the active zone.

The n-doped layer sequence 4 comprises an intermediate layer 5. The intermediate layer 5 is situated within the n-doped layer sequence 4 between the partial layer 17 and an n-doped current spreading layer 7, which is likewise part of the n-doped layer sequence 4. In other words, the intermediate layer 5 has no direct contact with the growth substrate 11 or with the active zone 3. A minimum thickness of the undoped layer 15 and/or of the partial layer 17 is, therefore, to be set at least such that the growth substrate 11 is substantially completely covered by at least one of layers 15, 17 and a side of layers 15, 17 that faces away from the growth substrate 11 is formed in substantially planar fashion.

A thickness T of the intermediate layer 5 is preferably 15 nm to 500 nm, in particular 25 nm to 150 nm. The intermediate layer 5 is based on AlGaN, wherein a proportion of 3% to 20%, in particular approximately 10%, of the gallium lattice sites, in comparison with pure GaN, is occupied by aluminum atoms. A dopant concentration of the intermediate layer in this example is preferably $4 \times 10^{18}$ per $cm^3$ to $5 \times 10^{19}$ per $cm^3$, especially $6 \times 10^{18}$ per $cm^3$ to $2 \times 10^{19}$ per $cm^3$. A dopant is silicon, for example. The intermediate layer 5 is a closed, continuous layer. In other words, no openings or perforations are produced in a targeted manner in the intermediate layer 5.

A buffer layer 6 of the semiconductor layer sequence 1 is formed by the partial layer 17, the intermediate layer 5 and the current spreading layer 7 and thus comprises the n-doped layer sequence 4. A thickness of the buffer layer 6 is, for example, 300 nm to 6 µm, preferably 500 nm to 1.8 µm inclusive. The thickness of the buffer layer 6 exceeds the thickness of the p-doped layer sequence 2, which is formed only by a single layer in the example in accordance with FIG. 1, preferably by at least a factor of 10 or by at least a factor of 20.

Figure 2:
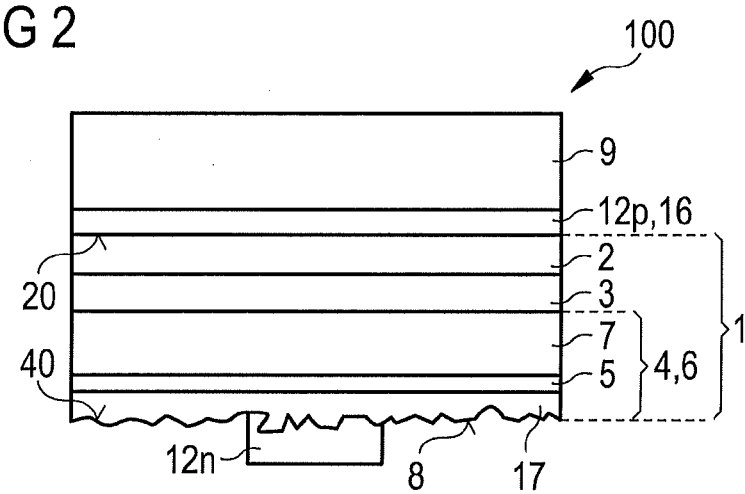

The example of the semiconductor chip 100 according to FIG. 2 is, for example, a development of the semiconductor chip 100 in accordance with FIG. 1. A p-type contact layer 12p is applied on a side 20 of the p-doped layer sequence 2 facing away from the active zone 3. The p-type contact layer 12p is formed, in particular, by one or a plurality of metallic layers and can constitute and/or comprise a mirror 16 for a radiation generated in the active zone 3. A carrier 9 is fitted at a side of the p-type contact layer 12p facing away from the active zone 3, the carrier mechanically carrying the semiconductor chip 100. The thickness of the carrier 9 is preferably 40 μm to 600 μm. The carrier 9 makes it possible to handle the semiconductor chip 100, for example, by a so-called "pick-and-place process."

A roughening 8 is produced, for example, by etching, at a side 40 of the partial layer 17 of the n-doped layer sequence 4 facing away from the active zone 3. The roughening 8 does not reach as far as the intermediate layer 5. As a result of producing the roughening 8, it is possible to completely remove the undoped layer 15 according to FIG. 1. By the roughening 8, a coupling-out efficiency of the radiation from the semiconductor chip 100 can be increased. An average roughness of the roughening 8 is preferably 0.4 μm to 4.0 μm, in particular 0.5 μm to 1.5 μm. Furthermore, an n-type contact-connection 12n is applied to the side 40 in which the roughening 8 is formed. The n-type contact-connection 12n is formed, in particular, by one or a plurality of metallic layers and/or by a transparent conductive oxide. In particular, the n-type contact-connection 12n is a so-called "bonding pad." Therefore, in accordance with FIG. 2, a current flow is also effected through the intermediate layer 5 such that it is necessary for the intermediate layer 5 to be in electrically conductive fashion, that is to say in particular in n-doped fashion.

The semiconductor chip 100 in accordance with FIG. 2 can be produced from the semiconductor chip 100 in accordance with FIG. 1 as follows: after the growth of the semiconductor layer sequence 100 on the growth substrate 11, the p-type contact-connection 12p is fitted and the carrier 9 is subsequently fitted onto the p-type contact-connection 12p. Afterward, the growth substrate 11 is removed from the semiconductor layer sequence 1 and the carrier 9, in particular by a laser lift-off method. In this case, a thin region of the n-doped layer sequence 4 situated near the growth substrate 11 is decomposed, more particularly a part of the undoped layer 15. After removal of the growth substrate 11 from the semiconductor layer sequence 1, the roughening 8 is formed in the partial layer 17 of the n-doped layer sequence 4 at the side 40 in particular by etching.

Figure 3:
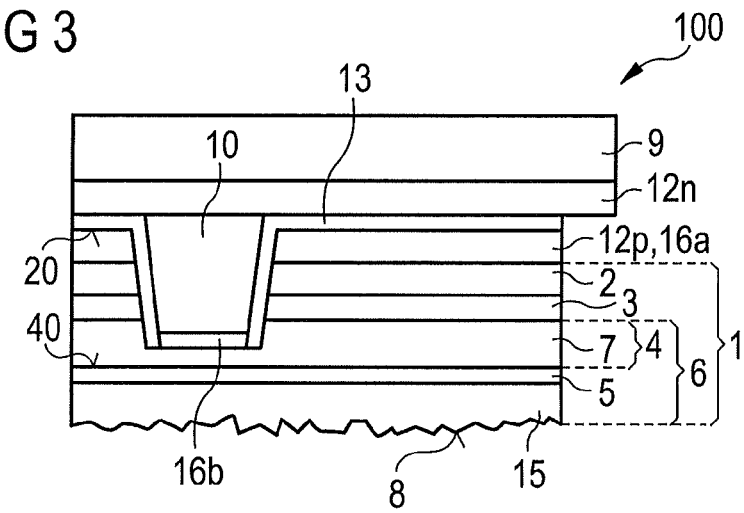

In the example of the semiconductor chip 100 in accordance with FIG. 3, the n-type contact-connection 12n and the p-type contact-connection 12p are situated at the same side of the active zone 3. This is made possible specifically by virtue of the fact that, proceeding from the n-type contact-connection 12n, a plated-through hole 10 is formed through the p-doped layer sequence 2 and through the active zone 3 toward the n-type layer sequence 4. The plated-through hole 10 can be formed by one or by a plurality of metals. A direct electrical connection between the n-type contact-connection 12n, which is formed between the carrier 9 and the p-type contact-connection 12p, and the current spreading layer 7 of the n-doped layer sequence 4 is produced via the plated-through hole 10.

The n-type contact-connection 12n and also the plated-through hole 10 are isolated from the active zone 3, the p-doped layer sequence 2 and the p-type contact-connection 12p by an electrically insulating layer 13, formed, for example, with a transparent material such as silicon dioxide or silicon nitride. In this example, the p-type contact-connection 12p also serves as a mirror 16a for the radiation which is generated in the active zone 3 during operation and which is coupled out from the semiconductor chip 100 via the roughening 8.

Preferably, a further mirror 16b, for example, a silver mirror, is fitted at a side of the plated-through hole 10 facing the roughening 8. Unlike what is depicted, it is possible for the mirror 16b also to extend partly or completely between the insulating layer 13 and the plated-through hole 10.

Therefore, in accordance with this example, the active zone 3 is not energized via the intermediate layer 5. Consequently, the intermediate layer 5, therefore, can also be undoped and have a higher Al content of between 5% and 50% inclusive or else be based on AlN or consist of AlN.

Figure 4:
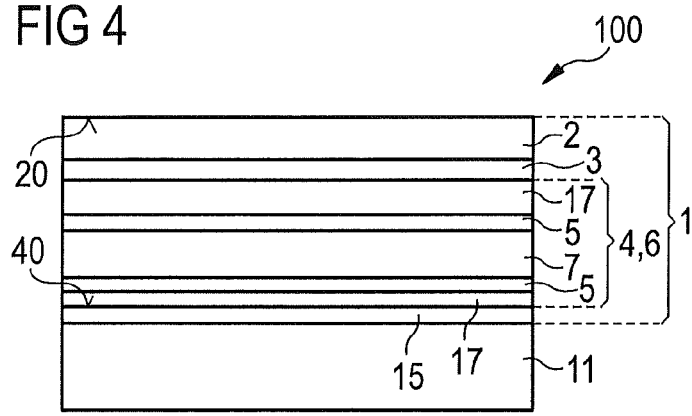

In the example in accordance with FIG. 4, the semiconductor layer sequence 1 of the semiconductor chip 100 comprises two intermediate layers 5. The highly n-doped current spreading layer 7 is situated between the two intermediate layers 5. The current spreading layer 7 is based, for example, on GaN and not on AlGaN like the intermediate layers 5 and has a high dopant concentration of preferably at least $5 \times 10^{18}$ per cm$^3$. The current spreading layer 7 preferably directly adjoins the two intermediate layers 5. The further construction of the semiconductor chip 100 in accordance with FIG. 4 substantially follows the example in accordance with FIG. 1.

Figure 5:
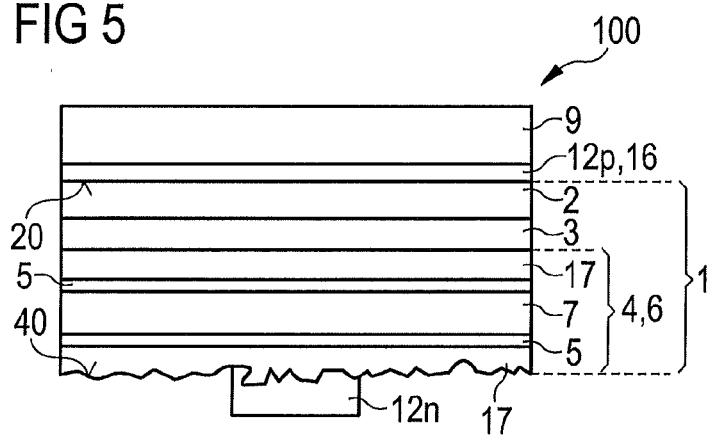

The semiconductor chip 100 in accordance with FIG. 5 is a development of the semiconductor chip 100 in accordance with FIG. 4, in an analogous manner to FIGS. 1 and 2. Since a current flow takes place from the n-type contact-connection 12n to the p-type contact-connection 12p via the two intermediate layers 5, the intermediate layers 5 are in doped and electrically conductive fashion.

Figure 6:
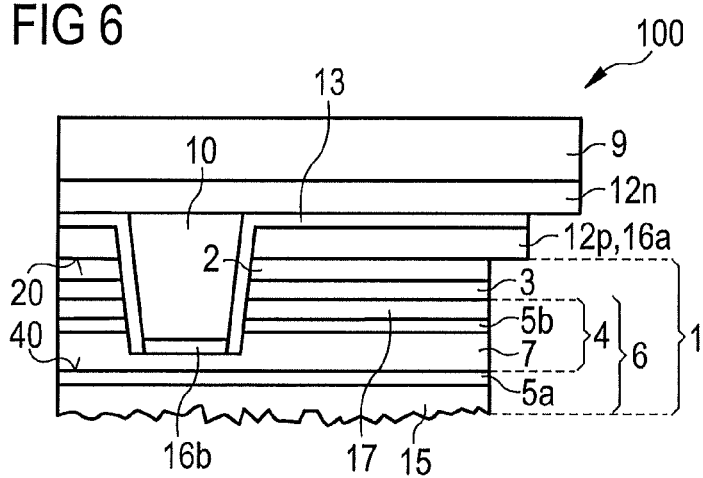

In the example of the semiconductor chip 100 in accordance with FIG. 6, the intermediate layer 5b is penetrated by the plated-through hole 10, whereas the intermediate layer 5a is an uninterrupted, continuous layer, like the intermediate layers 5 in accordance with FIGS. 1 to 5. The plated-through hole 10 electrically connects the n-type contact-connection 12n directly to the current spreading layer 7. In this example, the intermediate layer 5b penetrated by the plated-through hole 10 can serve for end point detection to etch the cutout for the plated-through hole 10. Since a current flow is not effected via the intermediate layer 5a, the intermediate layer 5a can be either doped or else undoped.

As also in all the other examples, it is possible for the intermediate layers 5, 5a, 5b and also the current spreading layer 7, the undoped layer 15 and/or the partial layer 17 to form a part of the buffer layer 6.

FIGS. 7A and 7B show a light emitting diode chip without intermediate layers. During the growth of the semiconductor layer sequence 1 on the growth substrate 11, cracks and/or holes 14 form either at the interface between the undoped layer 15 or the n-doped layer sequence 4 formed by a single layer in accordance with FIG. 7, and the growth substrate 11 or else during growth or during the laser lift-off method within the semiconductor layer sequence 1, cf. FIG. 7A. A portion of the cracks and/or holes 14 is uncovered upon separation of the growth substrate 11 from the semiconductor layer sequence 1, for example, by the laser lift-off method of FIG. 7B.

A proportion of the cracks and/or holes 14 reaches from the side 40 of the n-doped layer sequence 4 through to the p-type contact-connection 12p. Via the holes and/or cracks 14, it is possible that in a later method step, for example, to produce a roughening at the n-doped layer sequence 4, a liquid chemical such as nitric acid or potassium hydroxide solution passes through the semiconductor layer sequence 1 through to the p-type contact-connection 12p, that is to say completely penetrates the semiconductor layer sequence 1.

For instance, as a result of these chemicals, it is possible that the p-type contact-connection 12p, preferably mirror 16, 16a, is attacked or damaged as a result of which a reflectivity of the p-type contact-connection 12p can be reduced and a coupling-out efficiency of radiation from the semiconductor chip can thus be reduced. A risk of damage to the mirror 16b at the plated-through hole 10, see FIGS. 3 and 6, is even higher still, on account of the small distance between the mirror 16b and the roughening 8.

FIG. 8 illustrates an example of the semiconductor chip 100 with the intermediate layer 5, after the growth substrate 11 has been separated from the semiconductor layer sequence 1. Unlike what is depicted, it is likewise possible for only one of the layers 15, 17 to be present. The semiconductor layer sequence 1 in accordance with FIG. 8 also has cracks and/or holes 14 which run from the side 40 of the n-doped layer sequence 4 toward the p-type contact-connection 12p and which are uncovered as a result of a laser lift-off method, for example, at the side 40 facing the separated growth substrate 11.

However, in accordance with FIG. 8, all or at least some of the cracks 14 and/or holes 14 running from the side 40 toward the active zone 3 are covered and closed by the intermediate layer 5. During growth of the semiconductor layer sequence 1 or of the intermediate layer 5, elevations 50 of the intermediate layer 5 which extend away from the active zone 3 toward the growth substrate 11 arise in this case. The elevations 50 are formed with the same material as the intermediate layer 5. The elevations 50, therefore, extend in a plug-like manner into at least some of the cracks and/or holes 14 and are directly connected at least to a portion of lateral boundary areas of the cracks and/or holes 14, in a direction perpendicular to a growth direction of the semiconductor layer sequence 1. It is likewise possible for at least a portion of the cracks and/or holes 14 to be filled completely by a material of the elevations 50.

The intermediate layer 5 is, therefore, used as a type of seal or closure layer for the cracks and/or holes 14. This is made possible, in particular, by virtue of the fact that the intermediate layer 5 and the elevations 50 are formed with AlGaN instead of GaN. Aluminum atoms have a lower mobility than gallium atoms during epitaxial growth at a surface. This enables the cracks and/or holes 14 to be closed and partly filled.

Although during further epitaxial growth of the semiconductor layer sequence 1, further cracks and/or holes 14 can arise which reach, for example, from a side 40 of the n-doped layer sequence facing away from the growth substrate 11 as far as the p-type contact-connection 12p, there is no continuous connection through the cracks and/or holes 14 from a side of the layers 15, 17 facing away from the active zone 3 toward the p-type contact-connection 12p or toward the mirror 16b at the plated-through hole 10 in accordance with FIGS. 3 and 6. Consequently, the mirrors 16, 16a, 16b or some other material of the plated-through hole 10 or of the contact-connections 12n, 12p, such as, for example, Al, WN and/or Ti, is also not damaged during downstream process steps, in particular during those process steps in which chemicals having a lower viscosity are used. The effect of the sealing of cracks and/or holes 14 by the intermediate layer 5 is of importance especially when a distance between the roughening 8 or an outer boundary area of the semiconductor layer sequence 1 and the mirror 16, 16a, 16b is particularly small, as especially in the case of the examples in accordance with FIGS. 3 and 6.

Figure 9:
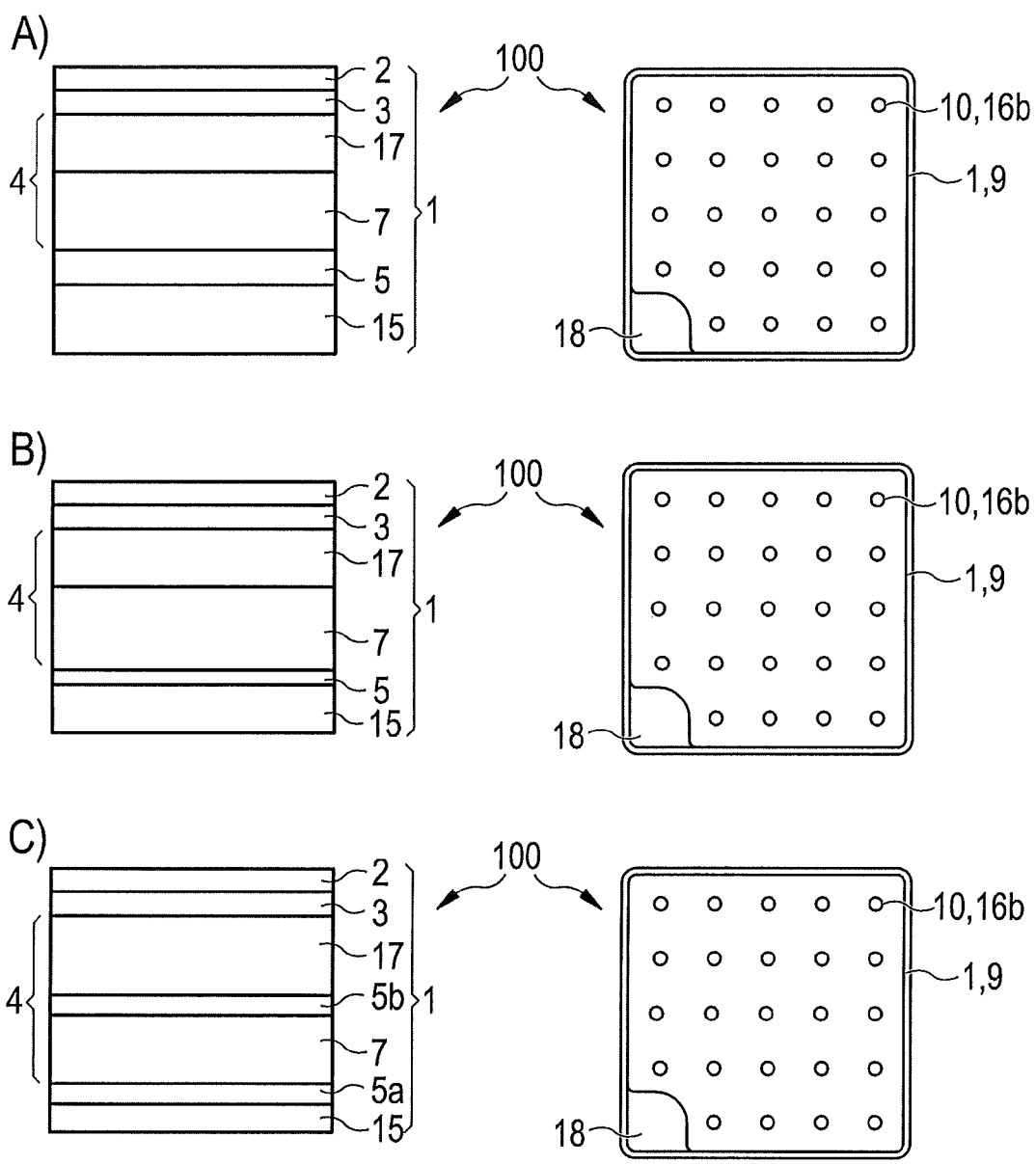

FIG. 9 shows further examples of the semiconductor chips 100 in a sectional illustration and in an associated plan view of a radiation passage side with a contact region 8, for example, for a bonding wire. The semiconductor chips 100 each comprise a plurality of the plated-through holes 10 and mirrors 16b (not depicted in the sectional illustrations), cf. FIGS. 3 and 6. The plated-through holes 10 and mirrors 16b therefore reach in each case from the p-conducting layer sequence 2 into the current spreading layer 7, which respectively has a thickness of approximately 1.1 µm.

The intermediate layer 5 has a thickness of approximately 60 nm in accordance with FIG. 9A, and a thickness of approximately 30 nm in accordance with FIG. 9B. The n-doped layer 17 in each case has a thickness of approximately 1.3 µm. In accordance with FIG. 9C, the current spreading layer 7 is situated between the two intermediate layers 5a, 5b each having a thickness of approximately 30 nm. Therefore, in each case at least one intermediate layer 5, 5a, 5b is present at a side of the current spreading layer 7 facing away from the active zone 3. In the associated plan views of the radiation passage side it can be seen that the mirrors 16b do not exhibit reduced reflectivity and are thus not damaged. In particular, more than 50% or more than 80% of the radiation leaves the semiconductor chip 100 through the radiation passage side.

Figure 10:
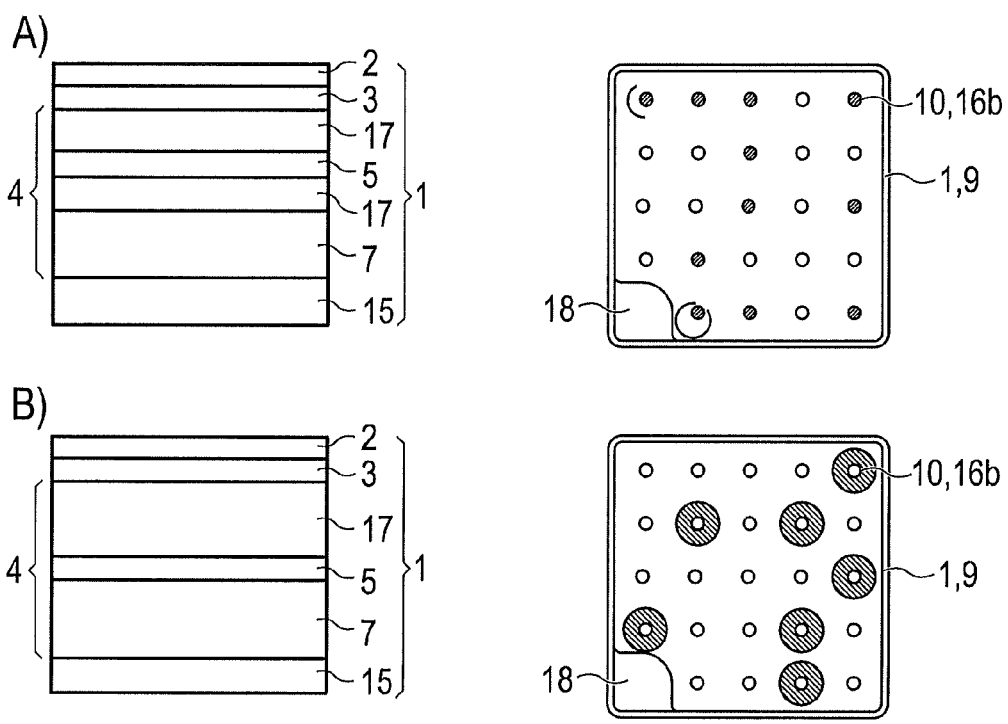
Figure 11:
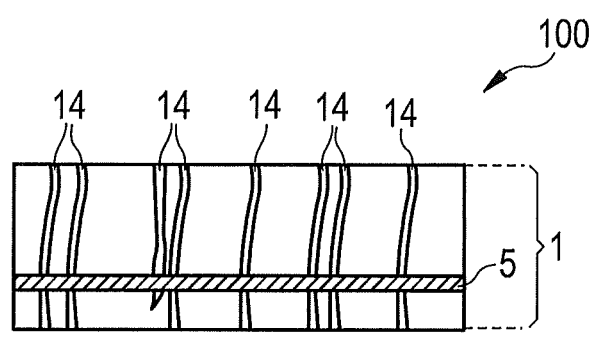

In the case of the light emitting diode chips in accordance with FIGS. 10A and 10B, the intermediate layers 5 are in each case situated between the current spreading layer 7 and the active zone 3. Therefore, no intermediate layer is present between the mirrors 16b and the radiation passage side. As a result, for instance during production of a roughening at the radiation passage side, the mirrors 16b are exposed to liquid chemicals and thereby damaged, discernible in a dark coloration and thus reduced reflectivity of the mirrors 16b.

In the example of the semiconductor chip 100, the semiconductor layer sequence 1 comprising the intermediate layer 5 is shown merely in a simplified manner in a sectional illustration. In particular, electrical contacts are not depicted. By virtue of the intermediate layer 5, the holes and/or cracks 14 in the semiconductor layer sequence 1 are reduced in a diameter or, in the region of the intermediate layer 5, are completely covered or blocked by the material of the intermediate layer 5.

As seen along the growth direction of the semiconductor layer sequence, therefore, the holes and/or cracks 14 are larger upstream of the intermediate layer 5 than downstream of the intermediate layer 5. Moreover, a direction along which the cracks and/or holes 14 run can be changed by the intermediate layer 5. As a result, the holes and/or cracks 14 are sealed with respect to liquid chemicals and/or with respect to vapors and/or the diffusion of metals.

By the intermediate layer 5, however, the holes and/or cracks 14 are not eliminated in the crystal lattice of the semiconductor layer sequence 1, but rather continued, as seen along the growth direction of the semiconductor layer sequence 1, downstream of the intermediate layer 5. In other words, it is possible for a number of the cracks and/or holes 14 not to be reduced or not to be significantly reduced by the intermediate layer 5. Regardless of the number of cracks and/or holes 14 remaining approximately the same on both sides of the intermediate layer 14, the holes and/or cracks 14 are impermeable to chemicals, however, by virtue of the material of the intermediate layer 5.

The chips and layers described here are not restricted by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. An optoelectronic semiconductor chip comprising:
   an epitaxially grown semiconductor layer sequence based on GaN, InGaN, AlGaN and/or InAlGaN,
   a p-doped layer sequence,
   an n-doped layer sequence,
   an active zone that generates an electromagnetic radiation, is situated between the p-doped layer sequence and the n-doped layer sequence, and is penetrated by an electrical plated-through hole, and
   at least one $Al_xGa_{1-x}N$-based intermediate layer where $0 \leq x \leq 1$, which is situated at a same side of the active zone as the n-doped layer sequence,
   wherein at least one of a) or b) is present:
   a) the intermediate layer has elevations extending into cracks and/or holes in a layer of the semiconductor layer sequence that adjoins the intermediate layer, wherein the elevations at least in places are in direct contact with boundary areas of the cracks and/or holes and at least some or all of the cracks and/or holes are completely covered by the intermediate layer,
   b) the intermediate layer reduces a size of the cracks and/or holes along a growth direction of the semiconductor layer sequence, wherein at least one portion of the cracks and/or holes extends on both sides of the intermediate layer.

2. The optoelectronic semiconductor chip according to claim 1,
   wherein a specific chemical permeability of the intermediate layer relative to liquids is less than for layers of the semiconductor layer sequence that adjoin the intermediate layer, and/or
   wherein the intermediate layer is impermeable to liquid chemicals.

3. The optoelectronic semiconductor chip according to claim 1,
   wherein a dopant concentration of the intermediate layer or of one of the intermediate layers is $4 \times 10^{18}$ per cm$^3$ to $5 \times 10^{19}$ per cm$^3$ and a dopant is Si.

4. The optoelectronic semiconductor chip according to claim 1,
   wherein the intermediate layer or one of the intermediate layers is undoped.

5. The optoelectronic semiconductor chip according to claim 1,
   wherein $0.03 \leq x \leq 0.5$,
   and which comprises exactly one or exactly two of the intermediate layers.

6. The optoelectronic semiconductor chip according to claim 1,
   wherein the intermediate layer has a thickness of 15 nm to 250 nm.

7. The optoelectronic semiconductor chip according to claim 1,
   wherein the intermediate layer or at least one of the intermediate layers is an uninterrupted, continuous layer.

8. The optoelectronic semiconductor chip according to claim 1,
   further comprising at least two of the intermediate layers and a GaN-based current spreading layer of the n-doped layer sequence, wherein the GaN-based current spreading layer is n-doped at least with a dopant concentration of $5 \times 10^{18}$ per cm$^3$, and wherein the GaN-based current spreading layer is situated between two of the intermediate layers and directly adjoins the latter.

9. The optoelectronic semiconductor chip according to claim 1,
   wherein a side of the semiconductor layer sequence that faces away from the active zone, on a same side of the active zone as the n-doped layer sequence, has a roughening having an average roughness of 0.4 μm to 4.0 μm.

10. The optoelectronic semiconductor chip according to claim 1,
    comprising at least two of the intermediate layers and further comprising an electrical plated-through hole that penetrates through one of the intermediate layers and a further one of the intermediate layers is uninterrupted and continuous.

11. The optoelectronic semiconductor chip according to claim 1,
    wherein a total thickness of the semiconductor layer sequence is 1.0 μm to 10.0 μm.

12. The optoelectronic semiconductor chip according to claim 1,
    comprising electrical contact-connections that energize the semiconductor chip which are all situated at a side of the p-doped layer sequence that faces away from the active zone.

13. An optoelectronic semiconductor chip comprising:
    an epitaxially grown semiconductor layer sequence based on GaN, InGaN, AlGaN and/or InAlGaN,
    a p-doped layer sequence,
    an n-doped layer sequence,
    an active zone that generates an electromagnetic radiation, is situated between the p-doped layer sequence and the n-doped layer sequence, and the n-doped layer sequence,
    at least one $Al_xGa_{1-x}N$-based intermediate layer where $0 < x \leq 1$, which is situated at a same side of the active zone as the n-doped layer sequence,
    wherein at least one of a) or b) is present:
    a) the intermediate layer has elevations extending into cracks and/or holes in a layer of the semiconductor layer sequence that adjoins the intermediate layer, wherein the elevations at least in places are in direct contact with boundary areas of the cracks and/or holes and at least some or all of the cracks and/or holes are completely covered by the intermediate layer,
    b) the intermediate layer reduces a size of the cracks and/or holes along a growth direction of the semiconductor layer sequence, wherein at least one portion of the cracks and/or holes extends on both sides of the intermediate layer, and
    another intermediate layer and a GaN-based current spreading layer of the n-doped layer sequence, wherein the GaN-based current spreading layer is n-doped at least with a dopant concentration of $5 \times 10^{18}$ per cm$^3$, and wherein the GaN-based current spreading layer is situated between two of the intermediate layers and directly adjoins the latter.

14. An optoelectronic semiconductor chip comprising:
    an epitaxially grown semiconductor layer sequence based on GaN, InGaN, AlGaN and/or InAlGaN,
    a p-doped layer sequence,
    an n-doped layer sequence,
    an active zone that generates an electromagnetic radiation, is situated between the p-doped layer sequence and the n-doped layer sequence,
    at least one $Al_xGa_{1-x}N$-based intermediate layer where $0 < x \leq 1$, which is situated at a same side of the active zone as the n-doped layer sequence,
    wherein at least one of a) or b) is present:

a) the intermediate layer has elevations extending into cracks and/or holes in a layer of the semiconductor layer sequence that adjoins the intermediate layer, wherein the elevations at least in places are in direct contact with boundary areas of the cracks and/or holes and at least some or all of the cracks and/or holes are completely covered by the intermediate layer, b) the intermediate layer reduces a size of the cracks and/or holes along a growth direction of the semiconductor layer sequence, wherein at least one portion of the cracks and/or holes extends on both sides of the intermediate layer, and another intermediate layer and an electrical plated-through hole that penetrates through one of the intermediate layers and a further one of the intermediate layers is uninterrupted and continuous.

* * * * *